US010200058B1

(12) United States Patent
Choi

(10) Patent No.: US 10,200,058 B1
(45) Date of Patent: Feb. 5, 2019

(54) ANALOG-TO-DIGITAL CONVERSION WITH MAGNETIC TUNNEL JUNCTIONS

(71) Applicant: SanDisk Technologies LLC, Plano, TX (US)

(72) Inventor: Won Ho Choi, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/961,296

(22) Filed: Apr. 24, 2018

(51) Int. Cl.
| H03M 1/12 | (2006.01) |
| G11C 11/16 | (2006.01) |
| H01F 10/32 | (2006.01) |
| H01L 27/22 | (2006.01) |
| H01L 43/08 | (2006.01) |

(52) U.S. Cl.
CPC ...... H03M 1/1245 (2013.01); H01F 10/3254 (2013.01); H01F 10/3272 (2013.01); H01F 10/3295 (2013.01); G11C 11/161 (2013.01); G11C 11/1673 (2013.01); H01L 27/222 (2013.01); H01L 43/08 (2013.01)

(58) Field of Classification Search
CPC .............. H03M 1/1245; H01F 10/3295; H01F 10/3272; H01F 10/3254; H01L 27/222; H01L 43/08; G11C 11/1673; G11C 11/161
USPC ................................................. 341/155, 159
See application file for complete search history.

(56) References Cited

U.S. PATENT DOCUMENTS

| 7,714,764 | B2* | 5/2010 | Houng ................. H03M 1/361 341/155 |
| 7,969,767 | B2 | 6/2011 | Li et al. |
| 9,240,799 | B1* | 1/2016 | Wang ................... H03M 1/142 |
| 9,368,716 | B2 | 6/2016 | Gu et al. |
| 9,620,706 | B2 | 4/2017 | Lee et al. |
| 2010/0258887 | A1 | 10/2010 | Zhu et al. |
| 2010/0302943 | A1 | 12/2010 | Rawlins et al. |
| 2011/0229985 | A1 | 9/2011 | Li |
| 2012/0280337 | A1 | 11/2012 | Cao et al. |
| 2013/0175644 | A1 | 7/2013 | Horng et al. |
| 2014/0099735 | A1 | 4/2014 | Horng et al. |

OTHER PUBLICATIONS

Choi, Won Ho et al., "An 8-bit Analog-to-Digital Converter based on the Voltage-Dependent Switching Probability of a Magnetic Tunnel Junction," Symposium on VLSI Technology, Jun. 2015, 2 pages, United States of America.

* cited by examiner

*Primary Examiner* — Khai M Nguyen

(57) ABSTRACT

Analog-to-digital conversion circuits are presented which employ magnetic tunnel junction (MTJ) elements that change state probabilistically in response to application of electrical pulses. Some implementations form a multi-channel analog-to-digital conversion circuit, with each channel comprising a magnetic tunnel junction (MTJ) element, and a pulse generator that determines characteristics of perturbation pulses to be applied to an MTJ element based at least on an analog input. The pulse generator also applies read pulses to the MTJ element to produce indications of magnetization state changes for the MTJ element due to application of the perturbation pulses. Each channel of the multi-channel analog-to-digital conversion circuit can include count circuitry that counts the indications of the magnetization state changes for an associated MTJ element. Outputs from each single-channel analog-to-digital converter are combined to determine a digital output representative of the analog input.

25 Claims, 8 Drawing Sheets

ANALOG-TO-DIGITAL CONVERSION WITH MAGNETIC TUNNEL JUNCTIONS

TECHNICAL FIELD

Aspects of the disclosure are related to the field of analog-to-digital conversion circuitry.

BACKGROUND

Analog-to-digital (A/D) conversion circuitry is widely deployed to convert analog input signals to digital representations. These digital representations typically comprise binary values proportional to associated analog input signals. A/D conversion circuitry can be employed to deliver digital representations of analog signals to various digital systems, such as measurement devices, processing devices, logic circuits, software systems, or other systems. However, most A/D conversions rely upon large integrated circuit arrangements of amplifiers, transistors, and various support circuitry to achieve desired accuracy, range, and linearity.

Attempts at employing a magnetic tunnel junction (MTJ) arrangement into an A/D conversion process have been undertaken. An MTJ operates using tunnel magnetoresistance (TMR), which is a magneto-resistive effect. MTJs typically consist of two ferromagnets separated by a thin insulator through which electrons can quantum-mechanically tunnel from one ferromagnet into the other. In the presence of thermal noise, a switching behavior of an MTJ due to flow of an input current can be observed to be stochastic in nature. However, present A/D approaches that employ an MTJ still have limitations with regard to linearity. Moreover, large sample periods can add unwanted latency or lag into A/D conversion processes, leading to poor performance in high-speed or latency-sensitive applications.

OVERVIEW

Analog-to-digital conversion circuits are presented which employ magnetic tunnel junction (MTJ) elements that change state probabilistically in response to application of electrical pulses. Some implementations form a multi-channel analog-to-digital conversion circuit, with each channel comprising a magnetic tunnel junction (MTJ) element, and a pulse generator that determines characteristics of perturbation pulses to be applied to an MTJ element based at least on an analog input. The pulse generator also applies read pulses to the MTJ element to produce indications of magnetization state changes for the MTJ element from previous application of the perturbation pulses. Each channel of the multi-channel analog-to-digital conversion circuit can include count circuitry that counts the indications of the magnetization state changes for an associated MTJ element. Outputs from each single-channel analog-to-digital converter are combined to determine a digital output representative of the analog input.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Figure 1:
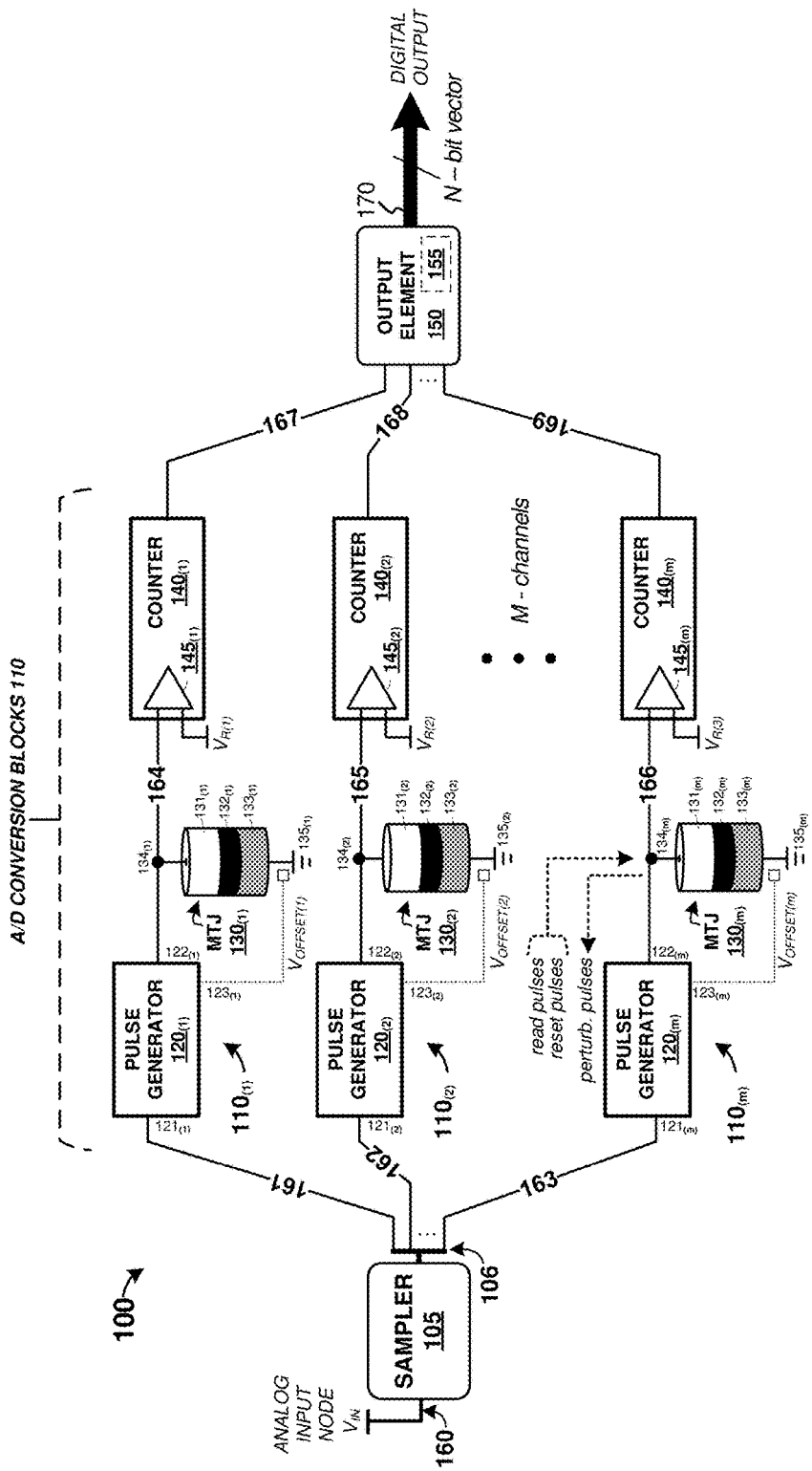
FIG. 1 illustrates an example analog-to-digital conversion system.

Discussed herein are various enhanced analog-to-digital (A/D) conversion circuits and arrangements that employ magnetic tunnel junction (MTJ) elements having probabilistic magnetization state switching properties. Various enhanced support circuitry, interconnect, and control systems are also discussed. In each A/D conversion circuit, at least one MTJ element is included along with circuitry to drive the MTJ element and count changes in magnetization states after perturbation pulses have been applied to the MTJ element. Large multi-channel arrays of individual A/D conversion circuits or single-channel analog-to-digital converters can be formed which advantageously provide for faster A/D conversion and greater linearity than single-channel A/D converters.

As used herein, magnetic tunnel junction elements or MTJ elements are each components of electrical circuits that consist of at least two layers of ferromagnetic materials separated by a thin insulator through which electrons can tunnel from one ferromagnetic layer into the other ferromagnetic layer. One ferromagnetic layer of an MTJ element can be referred to as a pinned layer which has a fixed magnetization state, while another ferromagnetic layer of an MTJ element comprises a free layer which can change in magnetization state. The intermediate layer comprising a thin insulator separating the two ferromagnetic layers can be formed from an oxide material or other suitable electrical insulator. Electrical terminals can be formed to interface the free and pinned layers of the MTJ element to other components in a circuit, referred to herein as free layer terminals and pinned layer terminals.

A spin-transfer torque (STT) MTJ element is one example arrangement of MTJ element than can be employed in A/D circuitry. STT refers herein to devices in which spin polarized currents reversibly switch a magnetization state of a ferromagnetic layer, namely a magnetization state of the free layer mentioned above. In the presence of thermal noise, a switching behavior of the free layer of a MTJ element due to flow of an applied perturbation pulse through an associated pinned layer can be observed to be stochastic in nature, and the probability of switching magnetization states in the MTJ element increases with the magnitude or duration of the applied perturbation pulse. Both perpendicular or parallel arrangements of MTJ elements can be employed, which refers to a type of magnetic anisotropy associated with a preferred direction of alignment in magnetic moments within the MTJ element, with respect to a surface of a corresponding semiconductor substrate.

The A/D conversion circuitry discussed herein employs multi-channel arrays of individual A/D conversion circuits or single-channel analog-to-digital converters that include corresponding MTJ elements and provide enhanced operation and A/D conversion functionality, while having scalable and selectable linearity, ease in manufacturability, as well as lower switching current than other previous approaches. Moreover, the A/D conversion circuits that employ MTJ elements herein can be assembled into dense horizontal arrays and vertical stack-ups. These vertical stack-ups allow deployment in multi-layered magnetic random-access memory (MRAM) configurations which might combine data storage MTJ elements along with MTJ elements employed in A/D conversion circuitry. In this manner, high density stack-ups of A/D circuits embedded in MRAM arrays can be built up from semiconductor substrates. Various interconnect and control logic can be formed on the same semiconductor substrate, allowing for large integrated memory and A/D conversion circuits to be established in a compact integrated circuit. Moreover, MRAM array control circuitry, such as address decoders, sense amplifiers, bit lines, word lines, and other circuitry/interconnect can be multi-purpose to handle both A/D conversion arrangements and data storage arrangements.

FIG. 1 is presented as a first example of an analog-to-digital conversion system that employs MTJ elements in a plurality of analog-to-digital converters, such as within single-channel analog-to-digital converters, referred to herein as A/D conversion blocks. FIG. 1 is a system diagram illustrating A/D conversion system 100. System 100 includes a plurality of single-channel A/D conversion blocks 110, indicated by designators $110_{(1)}$-$110_{(m)}$ in FIG. 1. System 100 also includes sampler 105 and output element 150. Analog input node ($V_{IN}$) 160 is coupled to sampler 150, which provides a sampled version of an analog input signal to A/D conversion blocks 110 over associated links 161-163. Outputs from A/D conversion blocks 110 are provided over links 167-169 to output element 150. Output element 150 provides digital output 170.

Each single-channel analog-to-digital converter, referred to in this example as A/D conversion blocks 110, converts an analog signal or analog voltage to a digital or binary representation. Furthermore, each A/D conversion block 110 includes several sub-components in FIG. 1, namely pulse generator 120, MTJ element 130, and counter 140 with optional sense amplifier 145. As with A/D conversion blocks $110_{(1)}$-$110_{(m)}$, the sub-components of each A/D conversion block also have corresponding designators (1)-(m). Pulse generators 120 receive the sampled version of the analog input signal over associated links 161-163, which then provide pulses over links 164-166 during perturbation sequences to corresponding MTJ elements 130. Counters 140 monitor magnetization state changes of MTJ elements 130 indicated on links 164-166, and produce counts of these magnetization state changes over links 167-169 to output element 150. Counters 140 can include optional sense amplifiers 145 to sense the magnetization state changes and convert indications of these state changes into desired signal levels, such as logic-level signals. When sense amplifiers 145 are employed, a sense reference voltage ($V_R$) can be coupled to a terminal of sense amplifiers 145, with sense terminals of sense amplifiers 145 coupled to associated ones of links 164-166. MTJ elements 130 are also coupled at pinned layer terminals to reference voltages, which might differ from the sense reference voltage ($V_R$), and is indicated by an example 'ground' potential in FIG. 1. However, in further examples, MTJ elements 130 can each be coupled to adjustable reference potentials via $V_{OFFSET}$, which are controlled by pulse generators 120.

In operation, a quantity 'm' of A/D conversion blocks 110 are deployed in a generally parallel fashion between sampler 105 and output element 150 to provide 'm' parallel single-channel A/D conversion operations. A particular sampling period is employed during which sampler 150 presents a sampled and held version of analog input node 160 at sample result terminal 106 to each of A/D conversion blocks 110. A/D conversion blocks 110 each produce a count that represents the voltage held at sample result terminal 106. These counts are then combined by output element 150 to produce a digital output at link 170. The digital output at link 170 comprises a digital representation of the voltage held at sample result terminal 106. Optional registers or memory element 155 can be included in output element 150 to store one or more digital outputs prior to transmission over link 170.

A mentioned above, each of A/D conversion blocks 110 includes a corresponding MTJ element 130. These MTJ elements can change magnetization states responsive to perturbation pulses applied by associated pulse generators 120. The magnetization state changes of MTJ elements 130 can be viewed as stochastic or probabilistic processes, which are affected by at least pulse width and pulse amplitude characteristics of the perturbation pulses. Pulse generators 120 each determine a perturbation sequence for a corresponding MTJ element 130 based on a sampled version of analog input node 160. The perturbation sequence typically includes three phases or operations, namely a reset phase, a perturbation phase, and a read phase—each with an accompanying pulse signal applied to the associated MTJ element. Characteristics of perturbation pulses applied during perturbation phases are determined by pulse generators 120 based at least on the sampled voltages received over links 161-163 and properties of MTJ elements 130. In FIG. 1, these pulses are shown for A/D conversion block 110m to exemplify pulses for any of A/D conversion blocks 110. Read pulses and reset pulses are applied in a first direction or polarity to MTJ elements 130, whereas perturbation pulses are applied to MTJ elements 130 in a second direction or polarity opposite that of the first direction.

Responsive to read pulses applied by pulse generators 120, MTJ elements 130 can indicate present magnetization states on associated links 164-166. Counters 140 can sense these present magnetization states and produce binary counts reflective of the number of changes in magnetization state that occur for each MTJ element over the corresponding sampling period. Since each MTJ element changes magnetization state according to both the applied perturbation pulses and stochastic properties of at least the MTJ element, then counts produced for each MTJ element can vary for the same sampled version of analog input node 160. Thus, counts produced during the sampling period by each counter 140 correspond to magnetization state changes experienced by each corresponding MTJ element. As mentioned above, output element 150 merges or combines these counts to produce a digital output corresponding to an A/D conversion of analog input node 160 into a digital value.

Turning now to a further discussion of the elements of FIG. 1, each of the control elements discussed herein might be comprised of discrete circuitry and logic, or might include integrated portions incorporated into processing systems, microprocessors. However, for the examples herein, exemplary discrete circuitry is discussed. MTJ elements 130 are typically discrete elements or formed among an array of MTJ elements, such as in a MRAM or other device.

Sampler 105 includes sample-and-hold circuitry configured to read an input signal at analog input node 160 and produce a sampled output at sample result terminal 106 for presentation to further elements of system 100. Sampler 105 can comprise operational amplifier circuitry, differential amplifier circuitry, capacitor storage elements, inductive storage elements, switching elements, transistor elements, transmission gate elements, clocking elements, or timing circuitry, among other elements. Analog input node 160 comprises an input node to system 100, which might comprise an electrical connection node coupled to an analog voltage or analog signal. Sampler 105 can read a voltage or signal ($V_{IN}$) and produce a sampled version which is held steady or constant at sample result terminal 106 over a particular sampling period. A control signal or enable signal can be introduced to sampler 105 by a control system or various control elements (not shown in FIG. 1 for clarity) to indicate when to sample and hold a new value from node 160.

Pulse generators 120 each comprise bidirectional pulse generation and delivery circuitry. Pulse generators 120 each have an associated pulse terminal 122 over which voltage or current pulses are transmitted, and a control terminal 121 to receive input voltages. Pulse generators 120 each comprise processing or logic circuitry to determine pulse widths and pulse amplitudes output over pulse terminal 122 based on an input voltage to the pulse generator at control terminal 121. The pulses produced by pulse generators 120 comprise voltage pulses or current pulses of a particular duration, amplitude, and direction or polarity. Various control signals can be presented to pulse generators 120 to initiate perturbation sequences comprising reset pulses, read pulses, and perturbation pulses. One or more switching elements, such as transistors or transmission gates, can be included in pulse generators 120 to selectively provide the various pulses during associated operational phases. Optional reference voltage adjuster elements can be provided that comprise voltage level shifting circuitry, voltage offset circuitry, operational amplifiers, sense amplifiers, and other circuitry can be included to create $V_{OFFSET}$ adjustments for associated MTJ elements as reference potentials coupled to the MTJ elements. Adjustable reference voltages can be provided over reference terminals 123.

Each magnetic tunnel junction (MTJ) element 130 comprises a spin transfer torque (STT) MTJ element, which has an alterable magnetization state. Each MTJ element 130 comprises a first ferromagnetic layer 131 and a second ferromagnetic layer 133 disposed on opposing sides of a thin insulating layer 132. The first ferromagnetic layer 131 of each MTJ element comprises a free ferromagnetic layer (referred to herein as a free layer) consisting of a ferromagnetic material that permits a magnetic moment of the corresponding ferromagnetic material to change orientation in response to an electromagnetic force. This change in magnetic moment orientation is referred to herein as a magnetization state, which changes relative to the second ferromagnetic layer 133 of each MTJ element. This second ferromagnetic layer 133 is referred to herein as a pinned layer, although other common nomenclature can be used, such as a reference layer or a fixed layer. The pinned layer of each MTJ element is a layer of ferromagnetic material that holds a magnetic moment of the corresponding ferromagnetic material in a predetermined or fixed state even under the influence of the electromagnetic force which might change the state of the free layer. When the free layer and the pinned layer are in the same magnetization state, then the MTJ element is considered to be in a parallel state (P). When the free layer and the pinned layer are in a different magnetization state, then the MTJ element is considered to be in an anti-parallel state (AP). Thus, the alterable magnetization state of MTJ elements discussed herein can change among two states, namely a parallel state and an anti-parallel state.

Due to probabilistic behavior of MTJ elements, each particular application of a perturbation pulse to an MTJ element may (or may not) change the magnetization state of the perturbation element. Thermal noise present in the MTJ element and thermal noise variations in associated perturbation pulse currents or voltages can add probabilistic or stochastic variability to magnetization state changing behaviors of the MTJ element. Properties of the perturbation pulses, such as magnitude and duration/width, can influence the probabilistic or stochastic switching behavior of the associated MTJ element. Thus, repeated perturbation or 'write' attempts can be performed followed by corresponding read and reset attempts to produce a change in magnetization state of the MTJ element. In the examples herein, perturbation pulse widths and amplitudes can be altered by pulse generators 120 according to sampled input signals, such as sampled/held by sampler 105 from analog input node 160. These alterations in perturbation pulse widths and amplitudes produce corresponding sequences of probabilistic magnetization state changes in each MTJ element which are reflective of a sampled/held version of analog input node 160.

Each MTJ element 130 also has corresponding terminals which can be used by external circuitry to apply pulses and reference voltages. Specifically, each MTJ element 130 has free layer terminal 134 which electrically couples free layer 131 of the MTJ to an electrical node or electrical circuit link. Each MTJ element 130 also has pinned layer terminal 135 which electrically couples pinned layer 133 of the MTJ to an electrical node or electrical circuit link. Typically, pinned layer terminal 135 is coupled to a reference node or adjustable reference node, and free layer terminal 134 is coupled to a pulse generator for application of voltage or current pulses.

Counters 140 produce count outputs by at least counting changes in magnetization state of corresponding MTJ elements 130. This change in magnetization state can be indicated by voltage or current changes produced on link 164 responsive to read pulses applied to the MTJ elements by pulse generators 120. Counters 140 can include sensing circuitry to sense the voltage or current changes which might comprise voltage spikes or current spikes. Sense amplifiers 145 can be included which sense these voltage or current changes with respect to a corresponding reference voltage, $V_R$. Sense terminals of sense amplifiers 145 are coupled to links 164-166, and reference terminals of sense amplifiers 145 are coupled to $V_R$ or ground voltages. Counters as discussed herein can include binary counting circuitry, which might comprise various logic circuitry, such as logic gates, flip flops, shift registers, and the like. Alternatively, counters can comprise microprocessor circuitry or systems with operational instructions to count changes in magnetization state of MTJ elements. Counters 140 produce count outputs consisting of bit vectors of a predetermined width/size that indicate cumulative counts of magnetization state changes for a particular MTJ element over a sampling period.

Output element 150 has one or more inputs that couple to count outputs of counters 140. Output element 150 also provides a digital output node for system 100, indicated by link 170 in FIG. 1. In some examples, output element 150 comprises an averaging element that is formed by summation circuitry, averaging circuitry, or output result combination and storage circuitry, among other elements. Summation circuitry or summation elements can include logical sum blocks, logical adders, arithmetic circuitry, or microprocessor circuitry configured to produce summed outputs, among other circuitry. Averaging circuitry or averaging elements can include the summation circuitry described above, as well as bit shifting logic, logical division circuitry, or microprocessor circuitry configured to produce averaged outputs, among other circuitry. In addition, output element 150 can include register 155. Register 155 can include one or more logical storage elements or memory elements that store a multi-bit vector representing the summed/averaged value output by link 170. One or more ranks or stages of registers or memory elements can be included to store multi-bit vectors corresponding to one or more A/D conversion cycles.

Figure 2:
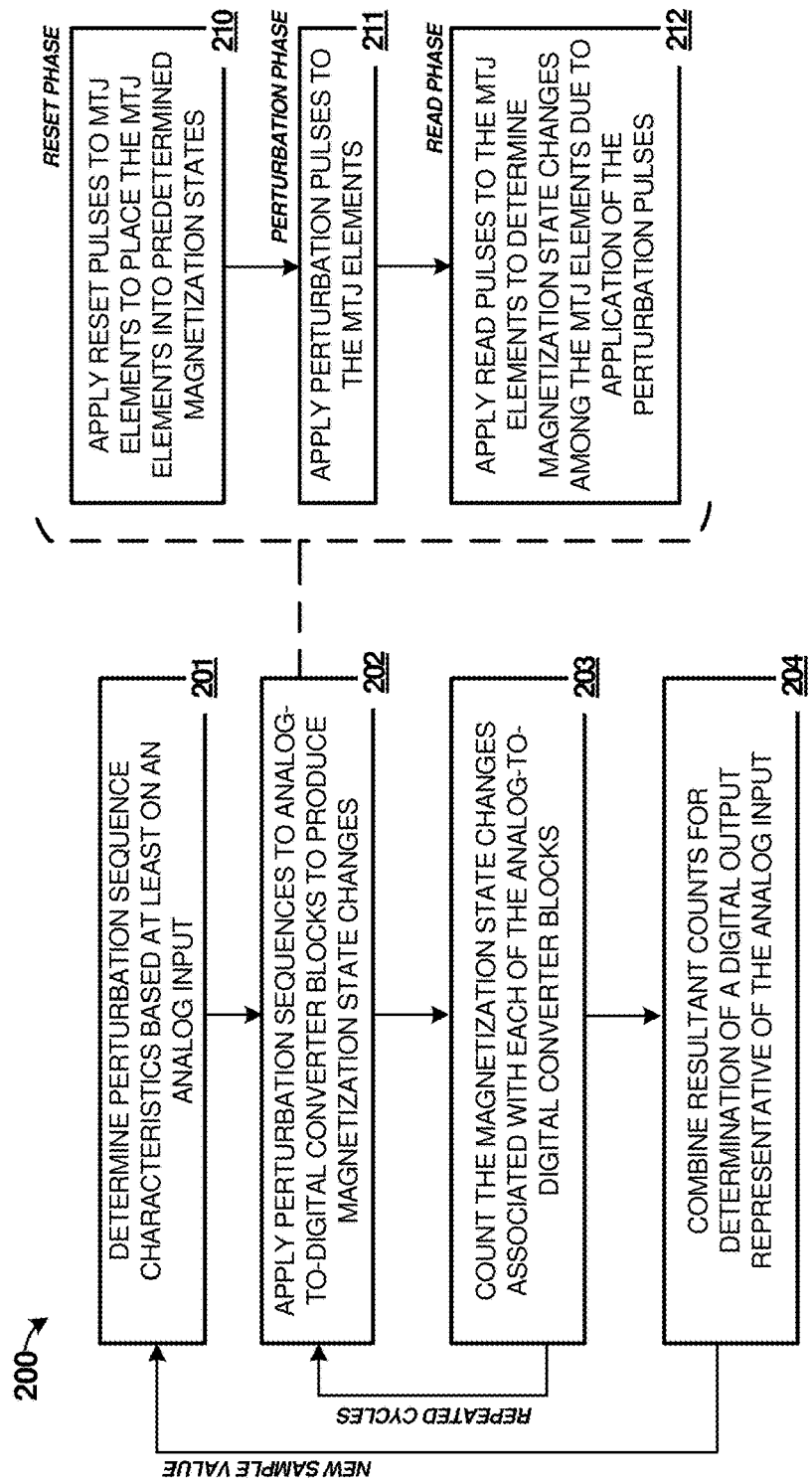
FIG. 2 illustrates an example operation of an analog-to-digital conversion system.

To further describe operation of the elements of FIG. 1, flow diagram 200 is presented in FIG. 2. FIG. 2 illustrates example operations of a multi-channel A/D conversion circuit comprising many parallel single-channel A/D conversion circuits. Although the operations of FIG. 2 are discussed in the context of FIG. 1, similar operations can be applied to systems and circuitry found in the other Figures presented herein. Operations of FIG. 2 can be controlled by individual elements of FIG. 1, although centralized or distributed control system might instead be employed.

In FIG. 2, pulse generators 120 determine (201) perturbation sequence characteristics based at least on an analog input. The analog input as discussed herein comprises an input signal or input voltage which is coupled to analog input node 160. The analog input is sampled by sampler 105 and presented over links 161-163 during a sampling period. The sampling period might comprise one or more cycles of perturbation sequences of MTJ elements 130. Sampler 105 holds the sampled version of analog input steady or within a predetermined voltage range for the sampling period. Each sampling period will correspond to sampler 105 taking a new sample for presentation over links 161-163. This sample presented by sampler 105 typically comprises a voltage level, although other configurations are possible.

Pulse generators 120 process the sampled version of analog input node 160 and determine characteristics of perturbation sequences to be applied in a repeated or cyclical fashion to the MTJ elements. Specifically, perturbation pulse widths and amplitudes can be modified according to a sampled voltage determined by sampler 105, such as in a proportional manner or other mathematical relationship. Once pulse widths/durations and amplitudes are determined for perturbation pulses, then pulse generators 120 apply (202) perturbation sequences (that include the perturbation pulses) to the analog-to-digital converter blocks to produce magnetization state changes in associated MTJ elements 130. It should be noted that pulse widths might be selected as the sole variable characteristic for perturbation pulses, while pulse amplitudes are produced at a fixed level. In other examples, pulse amplitudes, or combinations or pulse widths and pulse amplitudes, might be employed in the variations among perturbation pulses.

MTJ elements 130 probabilistically change magnetization state in response to each cycle of perturbation pulse application, after being reset into an initial magnetization state. Responsive to each application of the perturbation pulses, first ones of the MTJ elements 130 might change magnetization state, while second ones of the MTJ elements 130 might not change magnetization state. Thus, each application of perturbation pulses to MTJ elements 130 might produce a different set of MTJ elements which change magnetization state from a set of MTJ elements which do not change magnetization state. Although the characteristics of the perturbation pulses influence the probabilistic switching behavior of each MTJ element, stochastic behavior is still exhibited by each MTJ element with a probability of switching being influenced by the characteristics in the perturbation pulses. Since the characteristics of the perturbation pulses are determined based in part on the sampled version of analog input node 105, then switching behavior of each MTJ element will also be influenced by the sampled version of analog input node 105.

Magnetization state changes are read from each MTJ element during associated read phases, and counters 140 are configured to count (203) the magnetization state changes associated with each of the analog-to-digital converter blocks. Specifically, indications of the magnetization states will be produced at a free terminal of each MTJ element and counters 140 can detect these indications on associated links 164-166. Sensing elements might be employed by counters 140, such as sense amplifiers 145, to detect changes in magnetization state and produce a further indication to counters 140 in a desired signal format, such as a desired logic level or voltage level. Each state change can be indicated by a 'bit' counted by counters 140, and during the sampling period, a cumulative count of state changes is determined by counters 140 for each respective MTJ element. Counters 140 might comprise different configurations of counter logic, shift registers, flip-flops, or memory devices to store a cumulative count for the sample period. Multiple levels of memory or registers might be employed to queue up counts for many sampling periods. Alternatively, output element 150 might include these memory elements or registers as element 155 for storage of individual counts or final results for output on link 170.

In this example, for each sample period, counters 140 present cumulative counts over links 167-169, and output element 150 receives these counts. A plurality of A/D conversion blocks are employed (i.e. 'm' number of A/D conversion blocks), which might number in the dozens, hundreds, or thousands. Output element 150 combines (203) the individual counts received from each A/D conversion block into a result for presentation as a digital output over link 170. The digital output comprises a digital representation of the analog input originally sampled at analog input node 160. To combine the counts received from the plurality of A/D conversion blocks, output element 150 can include various logic, arithmetic circuitry, or processing systems which perform one or more mathematical operations on the counts. These mathematical operations can include an averaging function applied over all of the plurality of A/D conversion blocks. For example, 'm' number of A/D conversion blocks are employed to produce associated counts, and the individual counts each comprise an n-bit value that indicates a count of state changes for an associated MTJ element. A function can be applied to determine a summation of each n-bit count value divided by 'm' quantity of A/D conversion blocks. The digital output will thus comprise an n-bit vector composed of an average of all counts received from the A/D conversion blocks.

The digital output presented over link 170 can be provided to any external circuit, or to other circuitry which might be integrated with system 100. In some examples, the digital output over link 170 can be provided to a control system or host system for further control of system 100. When a host system is employed, this host system might comprise one or more computer systems, software elements, or other hardware/software control systems.

Returning to a discussion of the perturbation sequences, operations 202-203 are repeated during a sampling period in a cyclic fashion to produce the counts, with associated perturbation sequences applied for each cycle. One cycle through a sequence of reset, perturbation, and read phases comprises a perturbation sequence. Perturbation sequences can be repeated many times during each sampling period. The count values indicated above will correspond to the quantity of magnetization state changes that occur for each MTJ element during the sampling period resultant from the applied perturbation sequences. Operations 201-204 can be repeated for different sampling periods, such as when a new analog input is sampled by sampler 105 and held steady over links 161-163.

A more detailed discussion now follows regarding the perturbation sequences indicated in operation 202. As mentioned above, perturbation sequences comprise various phases, which in this example includes reset phases, perturbation phases, and read phases. Reset phases occur before perturbation phases to initialize MTJ elements into predetermined initial magnetization states. During reset phases (210), pulse generators 120 produce reset pulses having a relatively high pulse amplitude across the associated MTJ elements in a first polarity or first direction. Pulse generators 120 produce the reset pulse as a voltage pulse or current pulse introduced on links 164-166 of a corresponding MTJ element. Although reset pulses are applied in a similar direction/polarity as read pulses, reset pulses are typically of a higher magnitude (amplitude and/or duration) than read pulses. These reset pulses typically do not vary upon the sampled voltage and are instead a predetermined voltage pulse or current pulse that place the respective MTJ element into an initial magnetization state. The initial magnetization state can be anti-parallel (AP) or parallel (P), but in the examples herein an initial magnetization state of AP will be considered.

After each reset phase, a perturbation phase occurs (211). Perturbation phases occur before read phases to probabilistically switch magnetization states of MTJ elements using perturbation pulses. As perturbation pulses are applied, the MTJ elements can switch from an initial magnetization state established during the reset phase to a different magnetization state, or remain in the initial magnetization state. For example, if the initial magnetization state comprises the anti-parallel (AP) magnetization state, then the MTJ elements might individually change into parallel (P) magnetization states or remain in the AP states.

Read phases (212) occur after application of the perturbation pulses. During the read phases, pulse generators 120 apply read pulses to the MTJ elements to determine magnetization state changes among the MTJ elements due to previous application of the perturbation pulses. When a change in state occurs in a particular MTJ element, a read pulse will produce a signal at an electrical terminal coupled to the free layer of the MTJ element that indicates a change in magnetization state. This signal might comprise a voltage spike resultant from application of a read pulse to the MTJ element. A voltage spike can comprise a short-duration increase in voltage at the electrical terminal coupled to the free layer of the MTJ element resultant from a read current passing through the MTJ element. For the various MTJ elements in FIG. 1, voltage spikes can be provided over corresponding links 164-166 to counters 140 for further conditioning, voltage level conversion, or other handling by sense amplifiers 145. As magnetization states of MTJ elements are read out using the read pulses, counters 140 then count changes in the magnetization states for each associated MTJ element, as indicated in operation 203.

Figure 3:
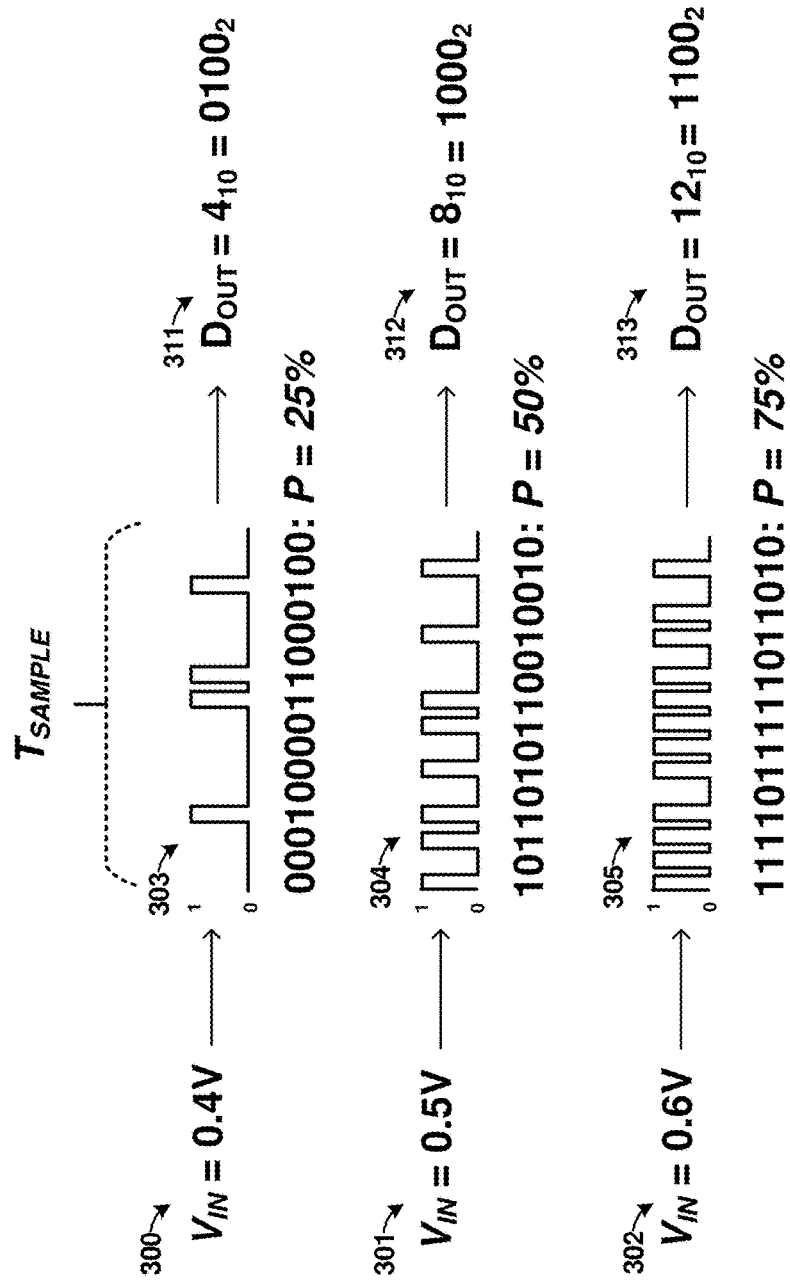
FIG. 3 illustrates example outputs of an analog-to-digital conversion system.

FIG. 3 is now presented to further illustrate example operations of the elements of FIG. 1. FIG. 3 is a waveform diagram presented to illustrate example outputs for a single channel of the multi-channel A/D conversion scheme of FIG. 1, such as for any of A/D conversion blocks 110. During a sample period indicated by $T_{SAMPLE}$ in FIG. 3, an input voltage presented to node 160 is sampled by sampler 105 and held at node 106. The sampled voltage at node 106 is provided to A/D conversion blocks 110 during the sample period, and pulse generators 120 generate perturbation sequences for corresponding MTJ elements. Thus, during this $T_{SAMPLE}$ period, several perturbation sequences are applied to an MTJ element. The example in FIG. 3 illustrates results from several perturbation sequences for an exemplary MTJ element.

Three example input voltages ($V_{IN}$) are shown in FIG. 3 as applied to analog input node 160, namely 0.4 volts (V) for example 300, 0.5V for example 301, and 0.6V for example 302. Output waveforms 303-305 are produced responsive to perturbation sequences applied to the associated MTJ element, which might include conditioning or filtering by an associated sense amplifier to other circuitry. Sixteen (16) example perturbation sequences are applied to the MTJ element in the examples of FIG. 3, with a corresponding pulse train representative of the particular input voltages, $V_{IN}$.

In FIG. 3, the example input voltages are each presented to a pulse generator which responsively generates perturbation sequences with characteristics determined in part from the input voltages. Specifically, pulse amplitudes or pulse widths of perturbation pulses are determined based on the input voltages, such as by a proportional or scaled translation from input voltages to pulse amplitudes or pulse widths of perturbation pulses. As the pulse generator presents each perturbation pulse to the MTJ element, the MTJ element will probabilistically either change magnetization state or remain in an initial magnetization state. Output waveforms 303-305 are reflective of resultant magnetizations states, with a 'high' or '1' level indicating a magnetization state change from an initial state and a 'low' or '0' level indicating no change in magnetization state from an initial state.

Each of output waveforms 303-305 has a corresponding quantity of magnetization changes probabilistically correlated to the input voltage $V_{IN}$. For output waveform 303 (corresponding to a $V_{IN}$ of 0.4V), four magnetization state changes occur over the sixteen perturbation sequences, indicating a switching probability of 25%. For output waveform 304, (corresponding to a $V_{IN}$ of 0.5V), eight magnetization state changes occur, indicating a switching probability of 50%. For output waveform 305 (corresponding to a $V_{IN}$ of 0.6V), twelve magnetization state changes occur, indicating a switching probability of 75%. A quantity of state changes, indicated by values of '1' in FIG. 3, are counted by a corresponding counter circuit, and an output count is determined for the $T_{SAMPLE}$ period. Output counts corresponding to the counted number of magnetization state changes of are indicated as output counts 311-313 in FIG. 3 in both base 10 (decimal) and base 2 (binary) representations. When a single channel A/D conversion system is employed, then the digital output ($D_{OUT}$) of the A/D converter is indicated by the associated count 311-313. However, in the examples herein where a multi-channel A/D conversion system is employed, these counts are further processed by output element 150, or other combiner elements, to determine a digital output.

Figure 4:
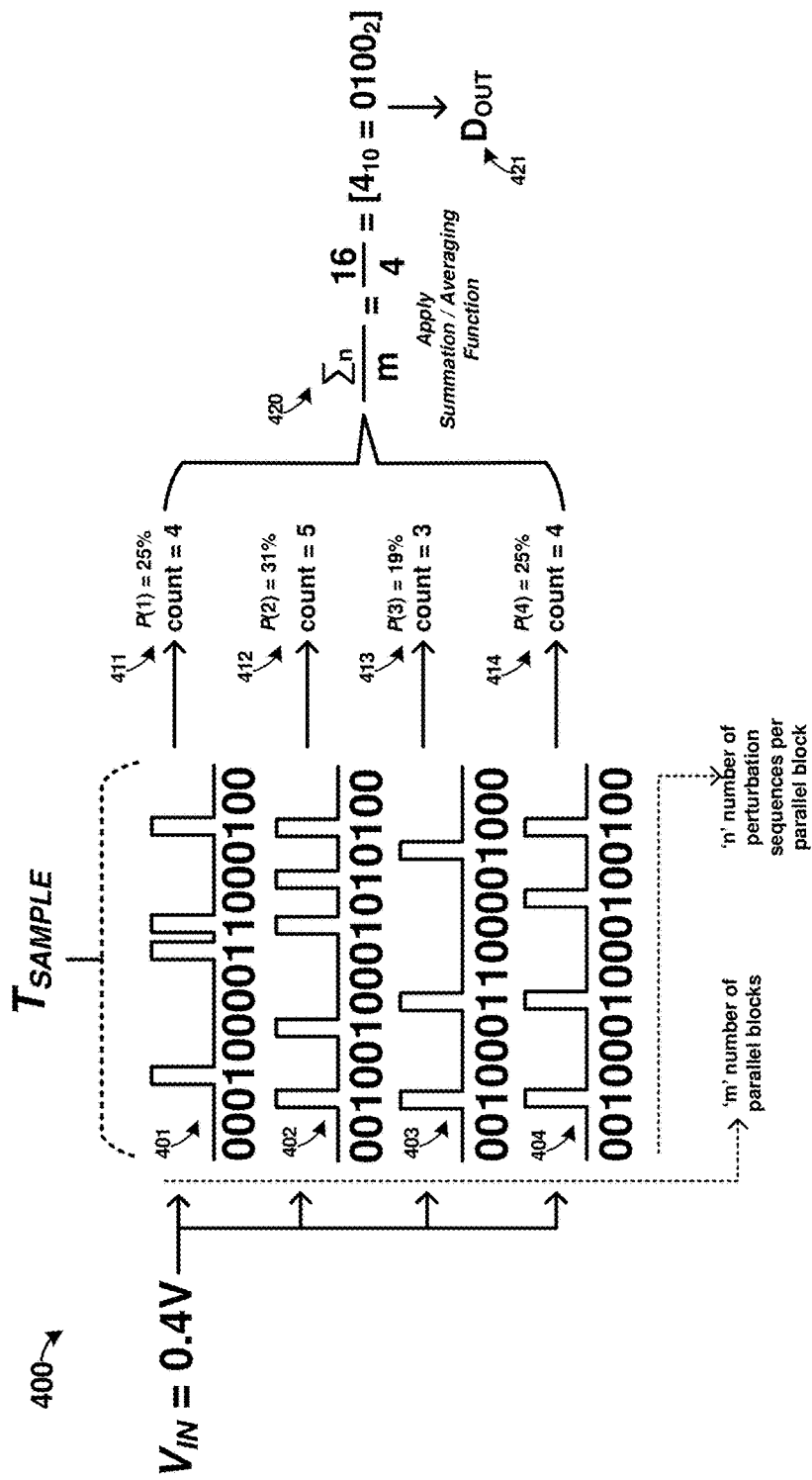
FIG. 4 illustrates example outputs of an analog-to-digital conversion system.

To illustrate a multi-channel A/D conversion system with corresponding output counts, FIG. 4 is presented. FIG. 4 is a waveform diagram 400 presented to illustrate example outputs for a multi-channel A/D conversion scheme of FIG. 1, such as for a combined usage of A/D conversion blocks 110. During a sample period indicated by $T_{SAMPLE}$ in FIG. 4, an input voltage presented to node 160 is sampled by sampler 105 and held at node 106. The sampled voltage at node 106 is provided to A/D conversion blocks 110 during the sample period, and pulse generators 120 generate perturbation sequences for corresponding MTJ elements. Thus, during this $T_{SAMPLE}$ period, several perturbation sequences are applied to an MTJ element.

The example in FIG. 4 illustrates results from several perturbation sequences for four MTJ elements employed in a parallel arrangement that form a four-channel A/D conversion system. Although four parallel A/D processes are shown in FIG. 4, this arrangement can be scaled up or down to 'm' number of parallel A/D conversion blocks, that have 'n' number of perturbation sequences applied per sample period. A selector or selection circuitry can be employed to select a desired number of parallel A/D conversion blocks to form the multi-channel A/D conversion system.

An example input voltage ($V_{IN}$) is shown in FIG. 4 as applied to analog input node 160, namely 0.4 volts (V). Output waveforms 401-404 are produced responsive to perturbation sequences applied to the associated MTJ elements, which might include conditioning or filtering by an associated sense amplifier to other circuitry. Sixteen (16) example perturbation sequences are applied to the MTJ elements in the examples of FIG. 4, with a corresponding pulse train representative of the particular input voltage, $V_{IN}$.

In FIG. 4, the example input voltage is presented to pulse generators which responsively generate perturbation sequences with characteristics determined in part from the input voltage. Specifically, pulse amplitudes or pulse widths of perturbation pulses are determined based on the input voltage, such as by a proportional or scaled translations from input voltage to pulse amplitudes or pulse widths of perturbation pulses. As the pulse generators present each perturbation pulse to the MTJ elements, the MTJ elements probabilistically change magnetization state or remain in an initial magnetization state. Output waveforms 401-404 are reflective of resultant magnetizations states, with a 'high' or '1' level indicating a magnetization state change from an initial state and a 'low' or '0' level indicating no change in magnetization state.

Each of output waveforms 401-404 has a corresponding quantity of magnetization changes probabilistically correlated to the input voltage $V_{IN}$, which in this example is 0.4V. Thus, when a plurality of A/D conversion blocks are employed, each block will output a binary representation of the input voltage which will probabilistically vary across a range of values. For output waveform 401, four magnetization state changes occur over the sixteen perturbation sequences, indicating a switching probability P(1) of 25%. For output waveform 402, five magnetization state changes occur, indicating a switching probability P(2) of 31%. For output waveform 403, three magnetization state changes occur, indicating a switching probability of 19%. For output waveform 404, four magnetization state changes occur, indicating a switching probability of 25%. A quantity of state changes, indicated by values of '1' in FIG. 4, are counted by counter circuits corresponding to each MTJ element, and a plurality of output counts are determined for the $T_{SAMPLE}$ period.

Output counts corresponding to the counted number of magnetization state changes are indicated as output counts 411-414 in FIG. 4. When a multi-channel A/D conversion system is employed, such as in FIG. 4, then the digital output ($D_{OUT}$) of the A/D converter is indicated by the $D_{OUT}$ 421. $D_{OUT}$ 421 is determined by calculation process 420 which combines the counts of each channel of the multi-channel A/D conversion system. Calculation process 420 comprises a sum of all counts ($\Sigma_n$) divided by the 'm' number of parallel A/D conversion blocks employed. In this example, $\Sigma_n$ corresponds to 16, and 'm' corresponds to 4, producing a $D_{OUT}$ of 4 (base 10) or '0100' (base 2). The digital output of '4' or '0100' corresponds to a digital representation of the analog input sampled at node 160, and thus an analog-to-digital conversion process occurs for the analog input. Repeated or cyclical sampling periods can be performed with a new sample of the analog input producing a new digital output.

Calculation process 420 is shown as an averaging function in FIG. 4. However, other calculation processes, mathematical algorithms, or processing functions can be applied. These might include weighted averaging, summation, statistical processing, among other functions. Also, individual count outputs might be provided to an external processing system or control system for flexible application of one or more mathematical functions to the count outputs used to produce a digital output.

Advantageously, the multi-channel A/D arrangements and operations shown in FIG. 1 and FIG. 4 provide for faster A/D conversion times with higher linearity for the A/D conversions than single-channel A/D conversion arrangements. Specifically, a large quantity of parallel blocks of A/D conversion elements are combined to produce a digital output. A relatively short sampling period having a corresponding small number of output counts are needed for each parallel block, as compared to single-channel arrangements, to achieve a linearity target for digital outputs. Since each parallel A/D conversion block has a corresponding output generated probabilistically using an MTJ element, then variation will occur among output counts of each A/D conversion block for a particular input voltage. This variation can be compensated for using a large selected number of parallel A/D conversion blocks.

Figure 5:
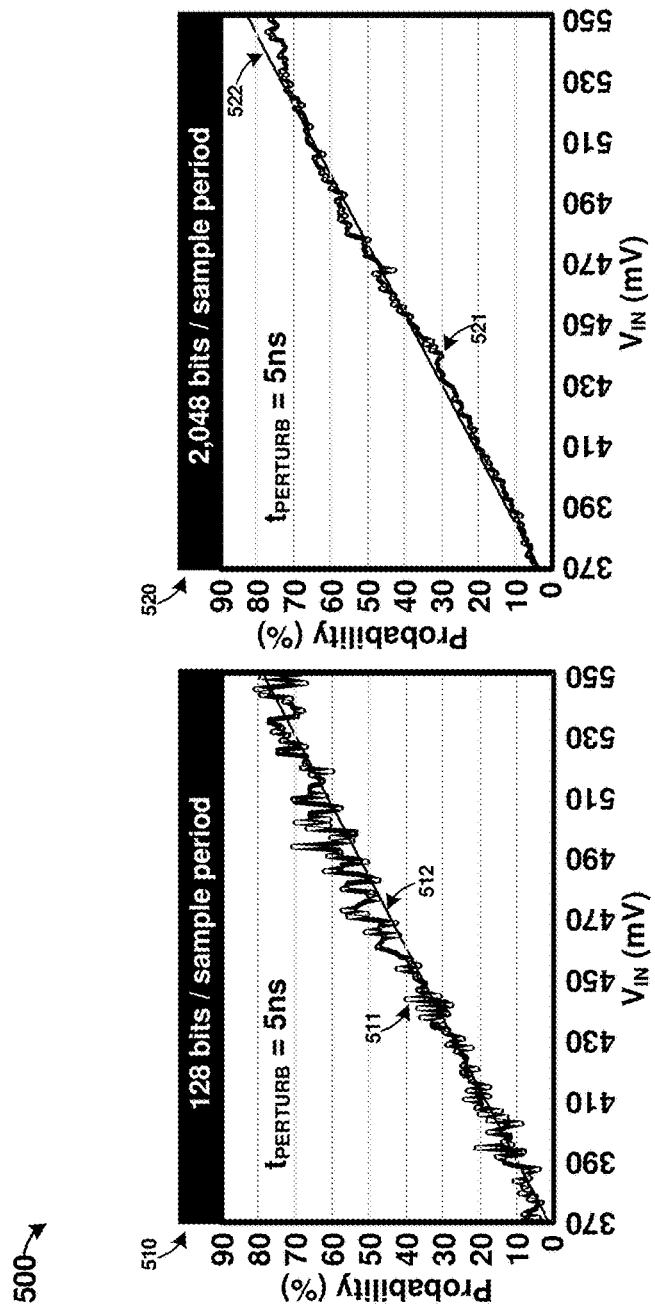
FIG. 5 illustrates example performance of an analog-to-digital conversion system.

FIG. 5 is now presented to discuss A/D conversion linearity in more detail. FIG. 5 illustrates examples 500 with two graphs 510 and 520 which show linearity variation among different bit/sample sizes. A sample size corresponds to a quantity of output bits obtained for one sample period, where the sample period allows for a plurality of perturbation sequences. To achieve a particular number of samples, in bits, a sample sizes might correspond to a longer sampling time for a single-channel A/D conversion arrangement, or to a much shorter sampling time for a multi-channel A/D conversion arrangement.

Specifically, graph 510 illustrates 128 bits per sample period, while graph 520 illustrates 2,048 bits per sample period. To obtain 128 bits or 2,048 bits per sample period for a single-channel A/D converter, a corresponding quantity of perturbation sequences (e.g. 128 or 2,048 sequences) are performed. In contrast, to obtain 128 bits or 2,048 bits per sample period for a multi-channel A/D converter, only 'n' quantity perturbation sequences are performed by 'm' parallel A/D conversion blocks, where 'n'×'m' corresponds to the quantity of perturbation sequences (e.g. 128 or 2,048). Thus, in one example, if 128 or 2,048 parallel A/D conversion blocks are employed, then only one perturbation sequence is required for a corresponding number of bits per sample period. If a smaller number of parallel A/D conversion blocks are employed, such as 100, then more perturbation sequences are performed.

However, linearity of any particular conversion process is proportional to the number of samples or bits obtained. Thus, a large number of bits are preferred to achieve linearity targets. Single-channel A/D conversion schemes would require long conversion times comprised of a large number of serial perturbation sequences. This can create lag or latency which limits how fast an input signal can change and still be reflected in the digital output, with considerations to limitations such as the Nyquist rate and other factors. Multi-channel A/D conversion arrangements can sample higher-frequency input signals as well as provide a selectable linearity based on how many parallel A/D blocks are employed.

Turning now to graph 510, a vertical axis indicates probability of switching magnetization state for an MTJ element, and a horizontal axis indicates pulse amplitude (in volts) for perturbation pulses applied to an MTJ element. Linearity curve 511 plots the relationship among switching probability and pulse amplitude for an MTJ element over 128 bits in a sample period, $T_{PERTURB}$, of 5 nanoseconds (ns). It can be seen in graph 510 that curve 511 is irregular and has several peaks and valleys which deviate from a linearity target 512. This deviation is partly related to the probabilistic nature of MTJ state switching, where MTJ elements might each switch differently in response to the same input stimulus, and the same MTJ element might also switch differently in response to subsequent input stimuli of the same amplitude.

Turning now to graph 520, a vertical axis indicates probability of switching magnetization state for an MTJ element, and a horizontal axis indicates pulse amplitude (in volts) for perturbation pulses applied to an MTJ element. Linearity curve 521 plots the relationship among switching probability and pulse amplitude for an MTJ element over 2,048 bits in a sample period, $T_{PERTURB}$, of 5 ns. It can be seen in graph 520 that curve 521 is smoother with less severe peaks and valleys as compared to curve 511. Thus, curve 521 deviates less from a linearity target 522 than does curve 511. As with curve 511, this deviation is partly related to the probabilistic nature of MTJ state switching, where MTJ elements might each switch differently in response to the same input stimulus, and the same MTJ element might also switch differently in response to subsequent input stimuli of the same amplitude. However, in graph 520, a much larger quantity of bits are produced for a given sample period, and thus any variations and differences in switching behavior or MTJ elements is mitigated.

When a single-channel A/D conversion arrangement is employed, obtaining 2,048 bits during a sample period would require at least 2,048 perturbation cycles for a single MTJ element. Advantageously, when the multi-channel A/D conversion arrangements are employed as discussed herein, these 2,048 bits can be obtained in a single perturbation cycle when 2,048 parallel A/D blocks are employed, or a greater number of perturbation cycles when less than 2,048 parallel A/D blocks are employed. The outputs of these parallel A/D blocks are combined as discussed herein to produce a digital output.

Figure 6:
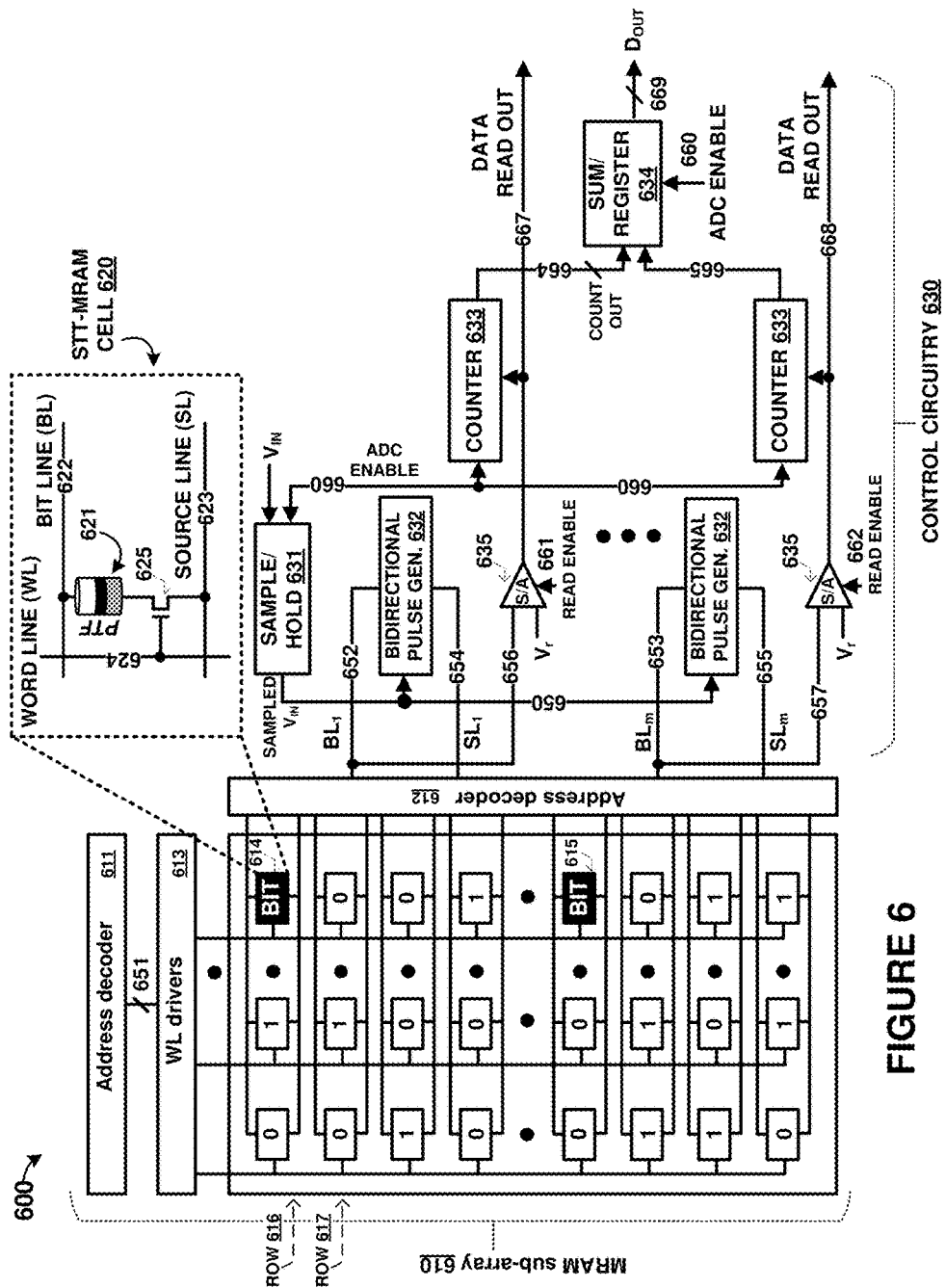
FIG. 6 illustrates an example array of analog-to-digital conversion circuitry.

To illustrate further architectures and arrangements for multi-channel A/D converters, FIG. 6 is presented. FIG. 6 illustrates example array 600 of analog-to-digital conversion circuitry, which is formed among an example magneto-resistive random-access memory (MRAM) array. Array 600 can be manufactured onto a semiconductor substrate along with various control logic, interconnect, or other circuitry. In some examples, an MRAM array will have wordlines and bitlines formed among MRAM devices spanning horizontally with respect to a substrate. Other array configurations and arrangements of MRAM arrays and associated control/interconnect logic can be formed that vary from that shown in FIG. 6, such as vertically stacked arrays.

Array 600 includes MRAM sub-array 610 and control circuitry 630. MRAM sub-array 610 is comprised of rows and columns of STT-MRAM cells, column address decoder 611, row address decoder 612, and word line (WL) drivers 613. A plurality of rows, such as shown for example rows 616-617, are formed from several STT-MRAM cells comprised of MTJ elements. Rows of MRAM sub-array 610 each have a corresponding bit line (BL) and source line (SL) controlled by row address decoder 612. Columns of MRAM sub-array 610 each have a corresponding word line (WL) controlled by column address decoder 611 and WL drivers 613. Thus, MRAM sub-array 610 forms an addressable array having a plurality of memory bits each formed from a corresponding MTJ element. Within each row of MRAM sub-array 610, a selected memory bit might be used for A/D conversion purposes, as discussed herein. Control circuitry 630 can select among the memory bits of MRAM sub-array 610 to employ various ones of the STT-MRAM cells for either memory storage or A/D conversion. Although only two example A/D conversion bits 614-615 are highlighted in FIG. 6, in further examples a larger number of bits are employed in large multi-channel A/D conversion systems formed among memory bits in an SRAM array. Thus, only a portion of a much larger SRAM array is shown by MRAM sub-array 610 in FIG. 6.

A detailed view of STT-MRAM cell 620 is shown as an example of any of the memory bits of MRAM sub-array 610. Although cell 620 is shown as expanded from bit 614, cell 620 can represent a structure/configuration of any of the memory bits included herein, whether employed as a memory storage element or as an A/D conversion element. Cell 620 is comprised of a STT-type of MTJ element 621, with pinned layer (P), tunnel layer (T), and free layer (F) shown. Switching element 625, which might comprise a transistor, selector, transmission gate, or other selectable element, is coupled at source and drain terminals between example source line (SL) 623 and pinned layer terminal of MTJ element 621. A control terminal of switching element 625 is coupled to example word line (WL) 624. A free layer terminal of MTJ element 621 is coupled to example bit line (BL) 622. The same STT-type of MTJ element is employed in memory storage applications and with A/D conversion applications.

Selection and control circuitry, comprised of portions of control circuitry 630 and portions of MRAM sub-array 610, can selectively employ ones of the memory bits in storage applications and other ones of the memory bits in A/D conversion applications. Thus, an adjustable and dynamic configuration among memory and A/D functions can be achieved in MRAM sub-array 610, such as when a different number of A/D elements might be desired for particular A/D conversion tasks. Memory bits not employed for A/D tasks might be employed to store count outputs of individual A/D conversion elements or digital outputs of multi-channel A/D systems, such as by using bit arrays formed from a plurality of memory bits of MRAM sub-array 610. The quantity of memory bits employed in A/D applications might be selected by control circuitry 630, or other control circuitry not shown in FIG. 6, to achieve linearity targets for sampling periods of the A/D conversion system. To achieve a higher linearity, more memory bits might be employed in the A/D conversion system. Conversely, to achieve a lower linearity, but possibly faster A/D conversion, fewer memory bits might be employed the A/D conversion system.

Turning now to control circuitry 630, the various circuitry shown in FIG. 6 is representative of at least a portion of control circuitry or control system elements for MRAM sub-array 610 and A/D conversion systems. Further elements might be included but are not shown in FIG. 6 for clarity. These further elements can include microprocessors, processing systems, host systems, and the like. Control circuitry 630 includes sample/hold circuit 631, bidirectional pulse generators 632, counters 633, sum/register block 634, and sense amplifiers 635.

Sample/hold circuit 631 receives an analog input ($V_{IN}$) at an input terminal, and samples $V_{IN}$. Sample/hold circuit 631 then holds this sample for a period of time referred to as the sample period or sampling period. During this sample period, one or more perturbation sequences are issued by bidirectional pulse generators 632 to corresponding MRAM cells. Each bidirectional pulse generator 632 is coupled to a sampled version of $V_{IN}$ provided at an output of sample/hold circuit 631, on link 650. Each bidirectional pulse generator 632 is also coupled to a bit line and source line for a particular memory bit of MRAM sub-array 610. For example, a first bidirectional pulse generator 632 is coupled to $BL_1$ at link 652 and $SL_1$ at link 654, and a given 'm' bidirectional pulse generator 632 is coupled to $BL_M$ at link 653 and $SL_M$ at link 655. Address decoder 612 can selectively couple links 652-655 to any row of MRAM sub-array 610, such as shown for rows corresponding to bit 614 and bit 615 in FIG. 6. In this manner, each bidirectional pulse generator 632 can apply pulses across a selected MTJ element. These pulses can have adjustable pulse widths and pulse amplitudes, as discussed herein. Moreover, each bidirectional pulse generator 632 can adjust a reference potential applied to the MTJ element by altering a reference potential of the MTJ element coupled at a corresponding source line to a pinned layer terminal of an MTJ element (through a corresponding selection element).

Also coupled to each bit line employed in the A/D arrangement, is a sense amplifier 635 which detects outputs of each MTJ element, such as over links 656 and 657 in FIG. 6. These outputs of each MTJ element correspond to changes in magnetization state of the MTJ elements responsive to perturbation pulses and subsequent read pulses issued by a corresponding bidirectional pulse generator 632. Each sense amplifier 635 is coupled at a sense input to a bit line (such as via links 656 and 657) and coupled at a reference input to a refence voltage, $V_R$. Typically, $V_R$ will be set to a ground potential or zero (0) volts, but this configuration might vary in other examples. Also, it should be noted that the refence voltage $V_R$ for each sense amplifier 635 might vary from a refence potential applied to each MTJ element. A read enable signal is coupled to each sense amplifier to gate sampling of the sense input to coincide with application of the read pulses by bidirectional pulse generators 632.

Outputs of sense amplifier 635 are provided to counters 633, or alternatively, as direct data for readout over links 667-668. The direct readout data can be coupled to external systems that are employed to substitute for elements of control circuitry 630, such as logic arrays, processing devices, host systems, or for conversion into other forms of interface signaling. However, in this example, counters 633 also receive outputs of sense amplifiers 633 over links 667-668. Each counter 633 is enabled by ADC (analog-to-digital conversion) enable signal presented over link 660, where the ADC enable signal indicates that an A/D conversion process is initiated. This ADC enable signal is also presented to sample/hold circuit 631 and sum/register block 634. Thus, these circuit elements enabled by ADC enable can be quiesced or inactive when an A/D conversion is not desired.

Counters 633 count changes in magnetization state responsive to each perturbation sequence applied to an MTJ element by bidirectional pulse generators 632. Count outputs are provided over links 664-665 to sum/register block 634. Count outputs each comprise a multi-bit binary value with sufficient digits to represent the maximum number of magnetization state changes per sampling period. Sum/register block 634 takes these individual count outputs as inputs and applies one or more combination processes to produce a digital output ($D_{OUT}$) at link 669. As discussed herein, the combination processes might comprise any mathematical algorithm, such as averaging functions or summation functions, which might further comprise vector operations on multi-bit vectors presented as count outputs from counters 633. $D_{OUT}$ comprises a bit vector of a predetermined bit width sufficient to digitally represent the analog input ($V_{IN}$) in a digital format.

Figure 7:
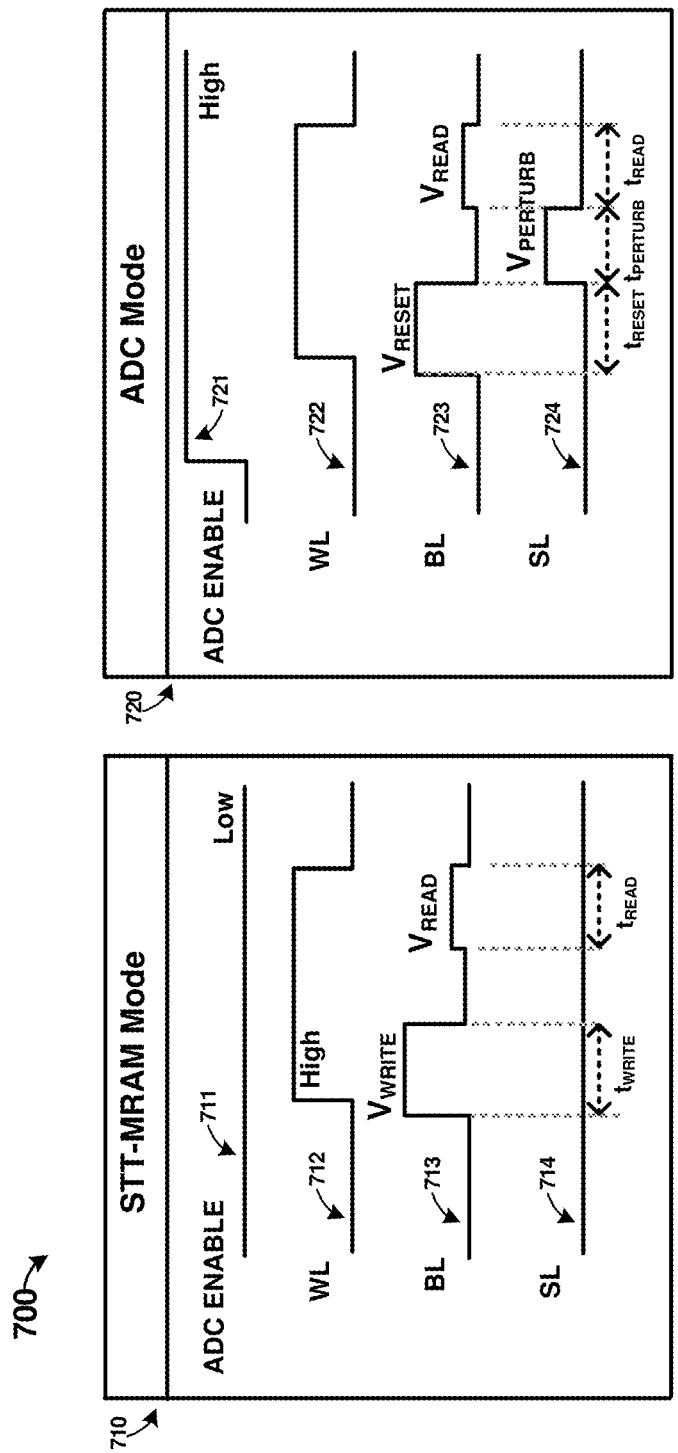
FIG. 7 illustrates example control operations of analog-to-digital conversion circuitry.

FIG. 7 illustrates example control operations 700 of analog-to-digital conversion circuitry, such as control portions of MRAM sub-array 610 and control circuitry 630. In FIG. 7, two functional modes are represented, namely STT-MRAM mode in signal view 710 and ADC mode in view 720. STT-MRAM mode corresponds to operating an MRAM cell as a memory storage bit, whereas ADC mode corresponds to operating an MRAM cell as an A/D converter element. Any of the memory bits in MRAM sub-array 610 can be operated in either STT-MRAM mode or ADC mode, depending upon the particular control signaling and connected control elements.

For signal view 710 representing the STT-MRAM mode, an ADC enable signal 711 is held at a logic low (or '0') level to ensure that elements tied to link 660 are inactive. Word line (WL) signal 712 indicates a low level followed by a logic 'high' (or '1') level to enable a particular selection element associated with a desired MTJ element, such as seen for the detailed view of cell 620. A bit line (BL) signal 713 has a $V_{WRITE}$ write voltage pulse applied for a $T_{WRITE}$ period to write a value into the MTJ element for storage. The source line (SL) signal is held low for the process of writing to act as a reference potential for the MTJ element. Thus, an MTJ element can be employed as a memory storage element for one bit of data. At a later time, this bit of data can be read out as the MTJ magnetization state by applying a $V_{READ}$ read voltage pulse to BL for a $T_{READ}$ period, as indicated in BL signal 713. $V_{READ}$ is of a lower relative voltage amplitude than $V_{WRITE}$, and exact values will vary based on implementation.

For signal view 720 representing the ADC mode, an ADC enable signal 721 is held at a logic high (or '1') level to ensure that elements tied to link 660 are active. Word line (WL) signal 722 indicates a low level followed by a logic 'high' (or '1') level to enable a particular selection element associated with a desired MTJ element, such as seen for the detailed view of cell 620. A bit line (BL) signal 723 has a $V_{RESET}$ reset voltage pulse applied for a $T_{RESET}$ period to reset the MTJ element into a preselected initial magnetization state, such as anti-parallel indicated by the polarity of the applied reset pulse. Then, a perturbation pulse ($V_{PERTURB}$) is applied by holding the BL to a low level while the SL signal 624 is briefly pulsed to $V_{PERTURB}$ for a duration of $T_{PERTURB}$. As discussed herein, the perturbation voltage/amplitude ($V_{PERTURB}$) and duration ($T_{PERTURB}$) vary according to the sampled input voltage presented to bidirectional pulse generators 632. This perturbation pulse probabilistically changes the magnetization state of the MTJ element according to characteristics of the perturbation pulse and other stochastic properties.

At a later time in signal view 720, the MTJ magnetization state can be read out by applying a $V_{READ}$ voltage pulse to BL for a $T_{READ}$ period, as indicated in BL signal 713. SL signal 724 is held low during this $T_{READ}$ period. $V_{READ}$ is of a lower relative voltage amplitude than $V_{RESET}$ and $V_{PERTURB}$, and exact values will vary based on implementation. In this example, the perturbation pulse ($V_{PERTURB}$) is applied in a different polarity or direction than the reset pulse and subsequent read pulse. Thus, bidirectional pulse generators 632 act in a bi-directional manner to apply corresponding voltage pulses across BL/SL pairs for each particular MTJ element. In this manner, an MTJ element can be employed as an analog-to-digital (A/D) conversion element.

Each A/D conversion element, comprising a single-channel analog-to-digital converter, is controlled in a similar fashion as described for operations in signal view 720 of FIG. 7, with the $V_{PERTURB}$ values set proportional to the sampled input voltage presented to bidirectional pulse generators 632 by sample/hold circuit 631. A selector can be configured to enable a selected quantity of a plurality of single-channel analog-to-digital converters to achieve a linearity target for digital outputs produced over link 669 based at least in part on estimated variability among probabilistic behavior characteristics of the associated MTJ elements of the plurality of single-channel analog-to-digital converters. The digital output produced over link 669 is representative of the analog input ($V_{IN}$) and comprises a bit vector having a quantity N of bits corresponding to a resolution of the digital output. A selector can select a quantity M of the plurality of single-channel analog-to-digital converters for inclusion into a multi-channel A/D conversion system to provide (2^N)/M bits in a particular sample period as the resultant counts output by counters 633. A selector as discussed herein can comprise elements of address decoders 611-612 as directed by as associated control system or host system. Alternatively, the selector can include switching elements, multiplexors, and logic circuitry to control selection operations.

Advantageously, large arrays of parallel-operated A/D conversion elements can be employed by array 600 to form multi-channel A/D conversion systems. As discussed herein, an array of single-channel analog-to-digital converters forms array 600. This array comprises 1-'m' single-channel analog-to-digital converters, which are represented schematically as individual A/D conversion blocks 110 in FIG. 1. In FIG. 6, these single-channel analog-to-digital converters are formed from selected MRAM rows having corresponding MTJ elements. These MTJ elements are each incorporated into single-channel analog-to-digital converters formed from the MTJ elements, portions of address decoders 611-612, bidirectional pulse generators 623, counters 633, sense amplifiers 635, and associated interconnect. Although coupled in a generally parallel fashion, each single-channel analog-to-digital converter may have associated connection circuitry, interface logic, or other interworking element to couple single-channel analog-to-digital converters to form an array. Inputs to each single-channel analog-to-digital converter are coupled to a sampled input voltage, while outputs to each single-channel analog-to-digital converter are combined to form an output signal.

Figure 8:
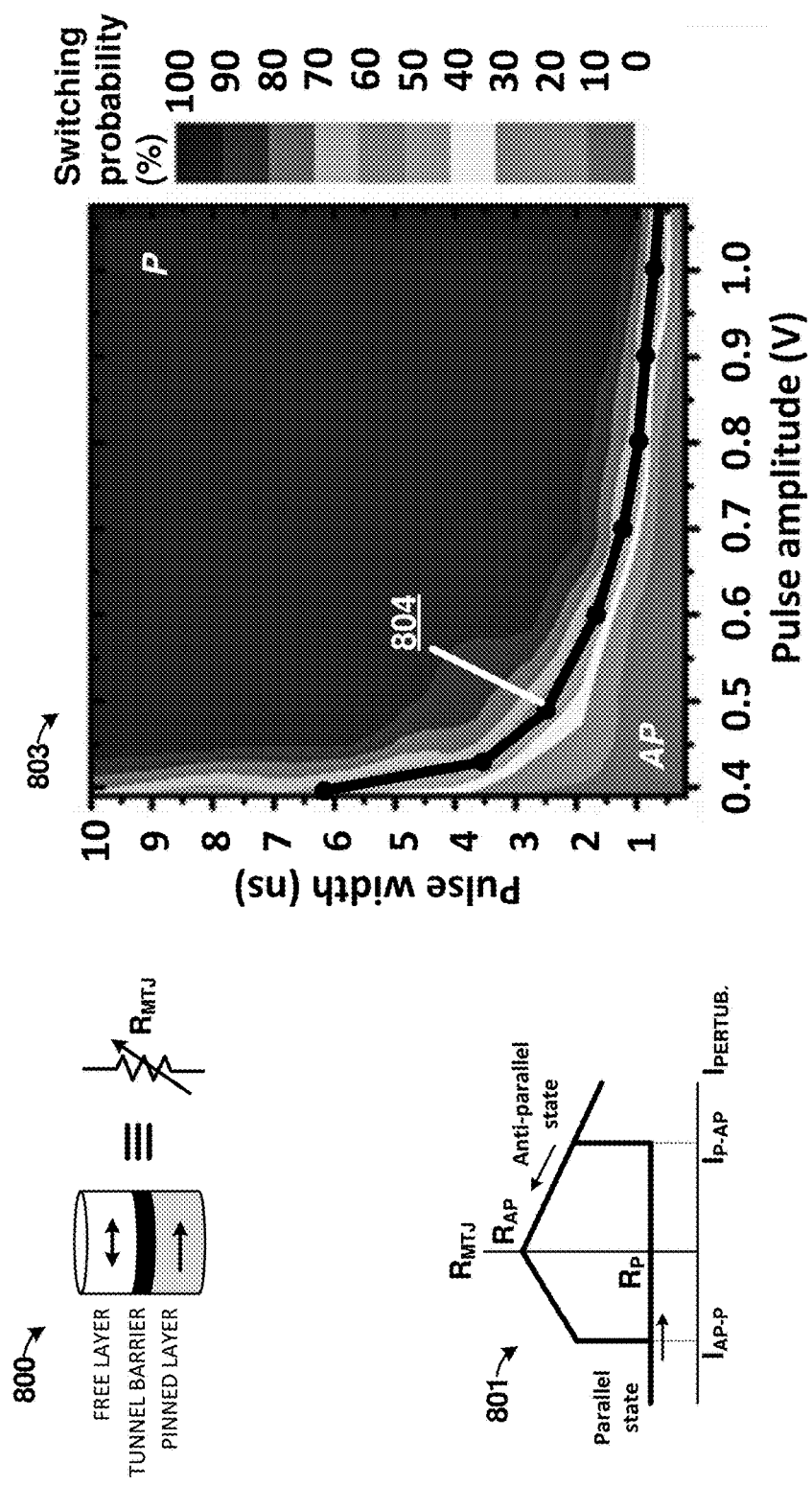
FIG. 8 illustrates example state operations of magnetic tunnel junction elements.

To further illustrate magnetization state changes among MTJ elements, FIG. 8 is presented. FIG. 8 illustrates operation of MTJ elements that switch states among an anti-parallel (AP) state and parallel (P) state. Example MTJ element configuration is shown having a pinned layer, tunnel barrier layer, and free layer. The pinned layer typically has a magnetization fixed in a particular orientation, such as shown in FIG. 8. The free layer can change orientation according to applied current or voltage pulses. When both the pinned layer and free layer are in the same magnetic orientation, then the two layers can be considered in the 'parallel' state. When the pinned layer and free layer are in different magnetic orientations, then the two layers can be considered in the 'anti-parallel' state. This MTJ element configuration can be represented schematically as a state-alterable resistor element shown in configuration 800.

To change states among the MTJ element, such as by changing relative magnetic orientations among the pinned layer and free layer, current or voltage pulses can be applied to the MTJ element. Graph 801 illustrates one example state change arrangement. Graph 801 shows how application of a perturbation current ($I_{PERTURB}$), an MTJ element can be placed from an initial AP state into a subsequent P state, and from an initial P state into a subsequent AP state. Hysteresis-like behavior is exhibited, where a sufficient magnitude (pulse amplitude) and duration (pulse width) of the perturbation current is needed to change the state of the MTJ element once it has changed into another state. The various P and AP states have an associated resistance ($R_{MTJ}$) associated therewith, indicated by the vertical axis in graph 801. In graph 801, the AP state has a high associated resistance ($R_{AP}$) relative to the P state, while the P state has a low associated resistance ($R_P$) relative to the AP state. These resistance changes can be utilized to produce an output responsive to a read pulse, as discussed herein.

As mentioned above, characteristics of a perturbation pulse, such as a magnitude and duration, can influence the state changes. Typically, a pulse or pulse train is applied to an MTJ element to attempt to change the state of the MTJ element. As seen in graph 803, this pulse can have a pulse width and pulse amplitude. The pulse width can be represented in seconds (or nanoseconds in FIG. 8), while the pulse amplitude can be represented in a voltage or amperage. FIG. 8 illustrates a voltage amplitude, which can induce a current for the MTJ element. Insufficient pulse width or pulse amplitude can lead to non-switching of the state of the MTJ element, as associated magnetization starts leaking once the applied pulse is removed. A sufficient pulse width or pulse amplitude, or a sufficient series of pulses, can lead to switching of states by the MTJ element. Thus, the MTJ element exhibits a probabilistic or stochastic behavior. Random thermal fluctuation in an MTJ element can be utilized for generating random bits. Switching probability is a strong function of characteristics of the applied perturbation pulse. Once the MTJ element changes magnetization state, the MTJ element has to be reset back to the initial state. Hence, the operation of the MTJ element can be resolved into three cycles, namely a "perturbation" phase followed by a "read" phase and "reset" phase.

Graph 803 of FIG. 8 provides an illustration of characterization of behavior of an MTJ element under various pulse widths (in nanoseconds) along the vertical axis and various pulse amplitudes (in voltage) along the horizontal axis. A 50% contour line 804 is shown to illustrate an example characteristic behavior of a true random number generator (TRNG) behavior of an MTJ element for a range of pulse widths and pulse amplitudes. Each contour shade indicates a region of associated switching probability for an MTJ element from an AP state to a P state. The various adjustable perturbation pulses discussed herein are generated based on an analog input voltage, and thus affect switching probability of the MTJ element as shown in graph 803. This switching probability will typically vary from the 50% contour line 804, and corresponds—on average—to the analog input voltage an associated pulse generator receives. Thus, the MTJ elements discussed herein can be employed to convert a range of analog input voltages into binary or digital outputs. As discussed herein, multi-channel A/D blocks are employed for faster conversion times and greater linearity in fewer perturbation cycles than single-channel A/D blocks.

In some implementations of the systems, circuitry, and elements discussed herein, a stochastic analog-to-digital converter circuit can be established. This analog-to-digital converter circuit can include a means for sampling an analog input, and a means for selectively producing perturbation pulses based on the analog input. This analog-to-digital converter circuit can also include a means for cyclical application of the perturbation pulses during a sample period to influence state changes in a plurality of magnetic tunnel junction (MTJ) elements, and a means for cyclical application of read pulses to the plurality of MTJ elements interleaved with the perturbation pulses to indicate the state changes among the plurality of MTJ elements. This analog-to-digital converter circuit can also include a means for counting the state changes during the sample period for each of the plurality of MTJ elements, and a means for producing a digital output representative of the analog input by at least combining counts determined for the state changes during the sample period. In further examples, this analog-to-digital converter circuit can also include a means for cyclical application of reset pulses to the plurality of MTJ elements after each application of the perturbation pulses to place the plurality of MTJ elements into predetermined magnetization states.

The means for sampling an analog input can comprise any of analog input node 160, sampler 105, node 106, links 161-163, control circuitry 630, sample/hold circuit 631, ADC enable link 660, and sampled output link 650, among other elements discussed herein. The means for selectively producing perturbation pulses based on the analog input, means for cyclical application of the perturbation pulses during a sample period to influence state changes in a plurality of magnetic tunnel junction (MTJ) elements, means for cyclical application of read pulses to the plurality of MTJ elements interleaved with the perturbation pulses to indicate the state changes among the plurality of MTJ elements, and means for cyclical application of reset pulses to the plurality of MTJ elements after each application of the perturbation pulses to place the plurality of MTJ elements into predetermined magnetization states can each comprise any of A/D conversion blocks 110, pulse generators 120, links 164-166, MRAM sub-array 610, control circuitry 630, bidirectional pulse generators 632, links 652-655, link 650, address decoder 611, WL drivers 613, address decoder 612, and associated bit lines, source lines, and word lines, among other elements discussed herein. The means for counting the state changes during the sample period for each of the plurality of MTJ elements can comprise any of A/D conversion blocks 110, counters 140, sense amplifiers 145, links 164-169, output element 150, register 155, control circuitry 630, counters 633, ADC enable link 660, sense amplifiers 635, sense input links 656-657, sense output links 667-668, read enable links 661-662, count output links 664-665, and sum/register block 634, among other elements discussed herein. The means for means for producing a digital output representative of the analog input by at least combining counts determined for the state changes during the sample period can comprise any of A/D conversion blocks 110, output element 150, register 155, digital output link 170, control circuitry 630, ADC enable link 660, sense output links 667-668, count output links 664-665, sum/register block 634, and digital output link 669, among other elements discussed herein.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above can be combined in various ways to form multiple embodiments. As a result, the invention is not limited to the specific embodiments described above, but only by the claims and their equivalents.

What is claimed is:

1. A circuit comprising:
    an analog input node;
    a sampler coupled to the analog input node and having a sample result terminal;
    a plurality of analog-to-digital converters, each comprising:
        a magnetic tunnel junction (MTJ) element coupled at a free layer terminal to a pulse terminal of a pulse generator;
        the pulse generator coupled at a control terminal to the sample result terminal, and configured to produce perturbation pulses across the MTJ element;
        a counter configured to produce a count output based on magnetization state changes sensed for the MTJ element in response to the perturbation pulses; and
    an averaging element comprising a digital output node for the circuit, wherein inputs to the averaging element couple to the count output of each of the plurality of analog-to-digital converters.

2. The circuit of claim 1, wherein the MTJ element comprises a spin transfer torque (STT) MTJ element having a magnetization state alterable by the perturbation pulses.

3. The circuit of claim 1, wherein the pulse generator is coupled at a reference terminal to a pinned layer terminal of the MTJ element; and
    wherein the pulse generator comprises a bidirectional pulse generation element to selectively produce reset pulses and read pulses through the MTJ element in a first direction, and selectively produce the perturbation pulses through the MTJ element in a second direction.

4. The circuit of claim 1, wherein the MTJ elements of each of the plurality of analog-to-digital converters comprise memory bits in a magnetic random-access memory (MRAM) array.

5. The circuit of claim 4, wherein bit lines of the MRAM array are coupled to the free layer terminals of corresponding MTJ elements forming the plurality of analog-to-digital converters and to the pulse terminals of corresponding pulse generators of the analog-to-digital converters, wherein source lines of the MRAM array are coupled to word line selection elements that selectively couple pinned layer terminals of the corresponding MTJ elements to the source lines, and wherein the source lines are further coupled to reference terminals of the corresponding pulse generators.

6. An apparatus comprising:
an array of single-channel analog-to-digital converters;
each of the single-channel analog-to-digital converters comprising:
a magnetic tunnel junction (MTJ) element;
a pulse generator configured to:
determine characteristics of perturbation pulses based at least on an analog input, apply the perturbation pulses to the MTJ element;
apply read pulses to the MTJ element to produce indications of magnetization state changes for the MTJ element due to application of the perturbation pulses; and
apply reset pulses to the MTJ elements before application of the perturbation pulses to place the MTJ element into a predetermined magnetization state; and
count circuitry configured to count the indications of the magnetization state changes; and
output circuitry coupled to outputs of the count circuitry from each of the single-channel analog-to-digital converters, and configured to determine a digital output representative of the analog input by at least combining the outputs of the count circuitry.

7. The apparatus of claim 6, further comprising:
a selector configured to enable a quantity of the single-channel analog-to-digital converters to achieve a linearity target for the digital output based at least in part on estimated variability among probabilistic behavior characteristics of the MTJ elements of the array of single-channel analog-to-digital converters.

8. The apparatus of claim 6, wherein each of the single-channel analog-to-digital converters further comprise:
a sense amplifier having a sense terminal coupled to a free layer terminal of the MTJ element to provide logic voltages to the count circuitry indicating the magnetization state changes.

9. The apparatus of claim 6, wherein the pulse generator is configured to receive the analog input as a control input that sets the characteristics of the perturbation pulse among at least one of a pulse width and pulse amplitude.

10. The apparatus of claim 6, wherein the MTJ element comprises a free layer terminal coupled to the pulse generator, and wherein the MTJ element has a pinned layer terminal coupled to a reference voltage.

11. The apparatus of claim 6, wherein each of the single-channel analog-to-digital converters further comprise:
a reference voltage adjuster configured to vary the reference voltage to adjust probabilistic behavior characteristics of the MTJ element.

12. The apparatus of claim 6, wherein the perturbation pulses are alternated with the read pulses and corresponding reset pulses for a predetermined sample period to produce a series of magnetization state changes counted by the count circuitry, and wherein the series of magnetization state changes counted by the count circuitry for each of the single-channel analog-to-digital converters is averaged over the array of single-channel analog-to-digital converters by the output circuitry to determine the digital output for the sample period.

13. A method of analog-to-digital conversion, comprising:
generating perturbation pulses based at least on an analog input, and applying the perturbation pulses to magnetic tunnel junction (MTJ) elements included in a plurality of single-channel analog-to-digital converters;
applying read pulses to the MTJ elements to determine magnetization state changes among the MTJ elements due to application of the perturbation pulses;
applying reset pulses to the MTJ elements before application of the perturbation pulses to place the MTJ elements into predetermined magnetization states;
counting the magnetization state changes associated with each of the plurality of single-channel analog-to-digital converters; and
combine resultant counts for determination of a digital output representative of the analog input.

14. The method of claim 13, further comprising:
repeating the perturbation pulses alternated with the read pulses and corresponding reset pulses for a predetermined sample period to produce a series of magnetization state changes counted for each of the plurality of single-channel analog-to-digital converters; and
averaging the resultant counts for the sample period to determine the digital output.

15. The method of claim 14, wherein the digital output representative of the analog input comprises a bit vector having a quantity N of bits corresponding to a resolution of the digital output; and further comprising:
selecting a quantity M of the plurality of single-channel analog-to-digital converters to provide (2^N)/M bits in the sample period as the resultant counts.

16. The method of claim 13, further comprising:
applying the perturbation pulses and the read pulses to free layer terminals of the MTJ elements as corresponding voltage pulses with first polarities;
applying the reset pulses to the free layer terminals of the MTJ elements as reset voltage pulses with second polarities opposite of the first polarities; and
wherein pinned layer terminals of the MTJ elements are coupled to reference voltages at least during application of the perturbation pulses, the read pulses, and the reset pulses.

17. The method of claim 16, further comprising:
varying the reference voltages to adjust probabilistic behavior characteristics of the MTJ elements from the perturbation pulses.

18. An analog-to-digital conversion system, comprising:
a magnetic random-access memory (MRAM) array formed from rows of data storage elements, and comprising address decoder circuitry configured to allocate selected rows among data storage portions and analog-to-digital conversion portions; and
control circuitry for the analog-to-digital conversion portions comprising:
one or more pulse generators configured to apply perturbation pulses across the data storage elements of the analog-to-digital conversion portions based in part on a sampled analog input;
one or more counters configured to count state transitions of the data storage elements responsive to the perturbation pulses; and
an output block configured to combine output counts of the one or more counters to determine a digital output representative of the analog input.

19. The system of claim 18, wherein the control circuitry for the analog-to-digital conversion portions is configured to cycle through application of the perturbation pulses followed by corresponding read pulses and corresponding reset pulses for a sample period to convert the analog input to the digital output;

wherein the read pulses are applied to determine the state transitions among the data storage elements due to application of the perturbation pulses; and wherein the reset pulses are applied to place the data storage elements into predetermined states prior to application of the perturbation pulses.

20. The system of claim 19, wherein the digital output representative of the analog input comprises a bit vector having a quantity N of bits corresponding to a resolution of the digital output; and wherein the address decoder circuitry selects a quantity M of the second set of the rows to provide (2^N)/M bits in the sample period.

21. The system of claim 18, wherein the data storage elements comprise magnetic tunnel junction (MTJ) elements having free layer terminals coupled to bit lines of the MRAM array, and pinned layer terminals coupled by selection elements to source lines of the MRAM array, and wherein control terminals of the selection elements are coupled to word lines of the MRAM array.

22. The system of claim 18, wherein amplitude and duration properties of the perturbation pulses provided by the one or more pulse generators is set by the sampled analog input, and wherein the perturbation pulses influence probabilistic magnetization state changes in the data storage elements.

23. The system of claim 18, wherein the one or more pulse generators apply the perturbation pulses and the read pulses over associated bit lines of the MRAM array as corresponding voltage pulses with first polarities;

wherein the one or more pulse generators apply reset pulses over the associated bit lines as reset voltage pulses with second polarities opposite of the first polarities; and wherein the one or more pulse generators apply reference voltages over associated source lines of the MRAM array during application of at least the perturbation pulses, the read pulses, and the reset pulses.

24. An analog-to-digital converter circuit comprising:

means for sampling an analog input;

means for selectively producing perturbation pulses based on the analog input;

means for cyclical application of the perturbation pulses during a sample period to influence state changes in a plurality of magnetic tunnel junction (MTJ) elements;

means for cyclical application of read pulses to the plurality of MTJ elements interleaved with the perturbation pulses to indicate the state changes among the plurality of MTJ elements;

means for counting the state changes during the sample period for each of the plurality of MTJ elements; and means for producing a digital output representative of the analog input by at least combining counts determined for the state changes during the sample period.

25. The analog-to-digital converter circuit of claim 24, further comprising:

means for cyclical application of reset pulses to the plurality of MTJ elements after each application of the perturbation pulses to place the plurality of MTJ elements into predetermined magnetization states.

* * * * *